(12) United States Patent
Yang et al.

(10) Patent No.: US 6,586,977 B2
(45) Date of Patent: Jul. 1, 2003

(54) FOUR QUADRANT ANALOG MIXER-BASED DELAY-LOCKED LOOP FOR CLOCK AND DATA RECOVERY

(75) Inventors: Fuji Yang, Old Bridge, NJ (US); Patrick Larsson, Union, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/947,488

(22) Filed: Sep. 6, 2001

(65) Prior Publication Data

US 2002/0097073 A1 Jul. 25, 2002

Related U.S. Application Data

(60) Provisional application No. 60/234,663, filed on Sep. 22, 2000.

(51) Int. Cl.[7] .................................................. H03L 7/06
(52) U.S. Cl. ........................................ 327/157; 327/235
(58) Field of Search ................................. 327/156, 142, 327/113, 157, 236, 237, 238, 148, 147, 235

(56) References Cited

U.S. PATENT DOCUMENTS

| | | | | |
|---|---|---|---|---|
| 6,078,200 A | * | 6/2000 | Miyano | 327/142 |
| 6,115,586 A | * | 9/2000 | Bezzam et al. | 327/113 |
| 6,194,929 B1 | * | 2/2001 | Drost et al. | 327/156 |

* cited by examiner

*Primary Examiner*—Dinh T. Le

(57) ABSTRACT

A delay-locked loop (DLL) and a method of performing clock and data recovery. In one embodiment, the DLL includes: (1) a phase detector that generates a phase difference signal based on a phase comparison between a data signal and a mixer output signal of the DLL and (2) a quadrant controller, coupled to the phase detector, that generates first and second voltage control signals based on the phase difference signal and first and second voltage control signals of the DLL.

20 Claims, 7 Drawing Sheets

FOUR QUADRANT ANALOG MIXER-BASED DELAY-LOCKED LOOP FOR CLOCK AND DATA RECOVERY

CROSS-REFERENCE TO RELATED APPLICATION

This Application claims the benefit of U.S. Provisional Application Ser. No. 60/234,663, filed on Sep. 22, 2000, by Larsson, et al., entitled "Four Quadrant Analog Multiplier Based DLL for Clock and Data Recovery" commonly assigned with the present invention and incorporated herein by reference.

TECHNICAL FIELD OF THE INVENTION

The present invention is directed, in general, to clock and data recovery circuits and, more specifically, to a four quadrant analog mixer-based delay-locked loop (DLL) for clock and data recovery.

BACKGROUND OF THE INVENTION

The exponential growth of high speed digital communication systems creates a tremendous demand for high speed chip-to-chip interconnect systems over short printed circuit board (PCB) traces or across a backplane. In such communication systems, data is transmitted without a separate clock signal and is typically referred to as asynchronous communication. Since a separate clock signal is not used, at a receiver side of a communications system, a so-called "clock recovery circuit" is employed to extract clock information from incoming data signals. Once extracted, the recovered clock is then used to re-time and regenerate the data originally transmitted. This clock and data recovery circuit (CDR) may be constructed with a phase-locked loop (PLL) or a delay-locked loop (DLL) circuit within the CDR.

A DLL performs a phase shift of a phase delay of an input clock signal and aligns the phase of the delayed clock to a reference signal. A voltage control delay element is employed in a DLL circuit to achieve the delay. One specific technique to realize this voltage control delay element is to use an analog quadrature mixer. Provided there are local in-phase and quadrature phase clock signals (usually denoted as I and Q, respectively), by multiplying the I and Q signals with first and second voltage control signals (for example, $V_A$ and $V_B$) and then adding the products together, an output signal $S_{out}$ may be expressed in the following equation.

$$S_{out}=(V_A \cdot I)+(V_B \cdot Q)$$

In this example, the phase of the output signal $S_{out}$ is directly controlled by the voltage control signals $V_A$, $V_B$. More specifically, if the first voltage control signal $V_A$ is decreasing and the second voltage control signal $V_B$ is increasing, the output signal $S_{out}$, represented as a vector, is moving towards the in-phase clock signal I. In addition, if the first voltage control signal $V_A$ is increasing and the second voltage control signal $V_B$ is decreasing, the output signal $S_{out}$ vector is moving towards the quadrature phase clock signal Q. This particular DLL technique has been employed in numerous conventional CDR systems.

Unfortunately, in such prior art systems, the phase interpolation to derive the output signal vector $S_{out}$ is only performed in the first quadrant, where the voltage control signals $V_A$, $V_B$ are both positive. Thus, in order to extend the phase interpolation to the other quadrants, switching between I and $I_B$, and Q and $Q_B$, is required, where $I_B$ and $Q_B$ are represented by signals 180 degrees out of phase with the in-phase and quadrature phase signals I, Q, respectively. Although successful in extending the phase interpolation of an output signal $S_{out}$ to the other quadrants, the switching operation introduces phase discontinuity at the quadrant borders, which typically results in large jitter in the CDR, as well as "phase jump" at the borders. Employing a PLL-based circuit to provide phase interpolation of the output signal Sout in all quadrants is also possible, however the large power consumption typical of PLL-based CDRs leads designers to lean towards DLL circuits. In addition, PLL circuits also often introduce excessive jitter to a CDR, primarily due to discrete phase selection steps characterized by this type of architecture, thus resulting in a phase interpolation that is not truly continuous.

Accordingly, what is needed in the art is DLL circuitry for clock and data recovery that does not suffer from the deficiencies found in the prior art.

SUMMARY OF THE INVENTION

To address the above-discussed deficiencies of the prior art, the present invention provides DLL circuits and method of recovering a clock signal and data. One DLL includes: (1) a phase detector that generates a phase difference signal based on a phase comparison between a data signal and a mixer output signal of the DLL and (2) a quadrant controller, coupled to the phase detector, that generates first and second control signals based on the phase difference signal and first and second voltage control signals of the DLL.

In another aspect, the present invention provides a method of performing clock and data recovery. In one embodiment, the method includes generating a phase difference signal based on a phase comparison between a data signal and a mixer output signal of the DLL, and generating first and second voltage control signals based on the phase difference signal and first and second voltage control signals of the DLL.

In yet another aspect, the present invention provides a four quadrant DLL circuit. This DLL includes a phase detector that generates a phase difference signal based on a phase comparison between a data signal and a mixer output signal of the DLL, and a quadrant controller, coupled to the phase detector, that generates first and second voltage control signals based on the phase difference signal and first and second voltage control signals of the DLL. The DLL further includes an amplitude controller, coupled to the quadrant controller, that generates in-phase and quadrature phase control signals based on the first and second voltage control signals and the first and second voltage control signals. Also included are in-phase and quadrature phase charge pump circuits, coupled to the amplitude controller, that generate the first and second voltage control signals based on the in-phase and quadrature phase control signals. The DLL still further includes a mixer coupled to the in-phase and quadrature phase charge pump circuits.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
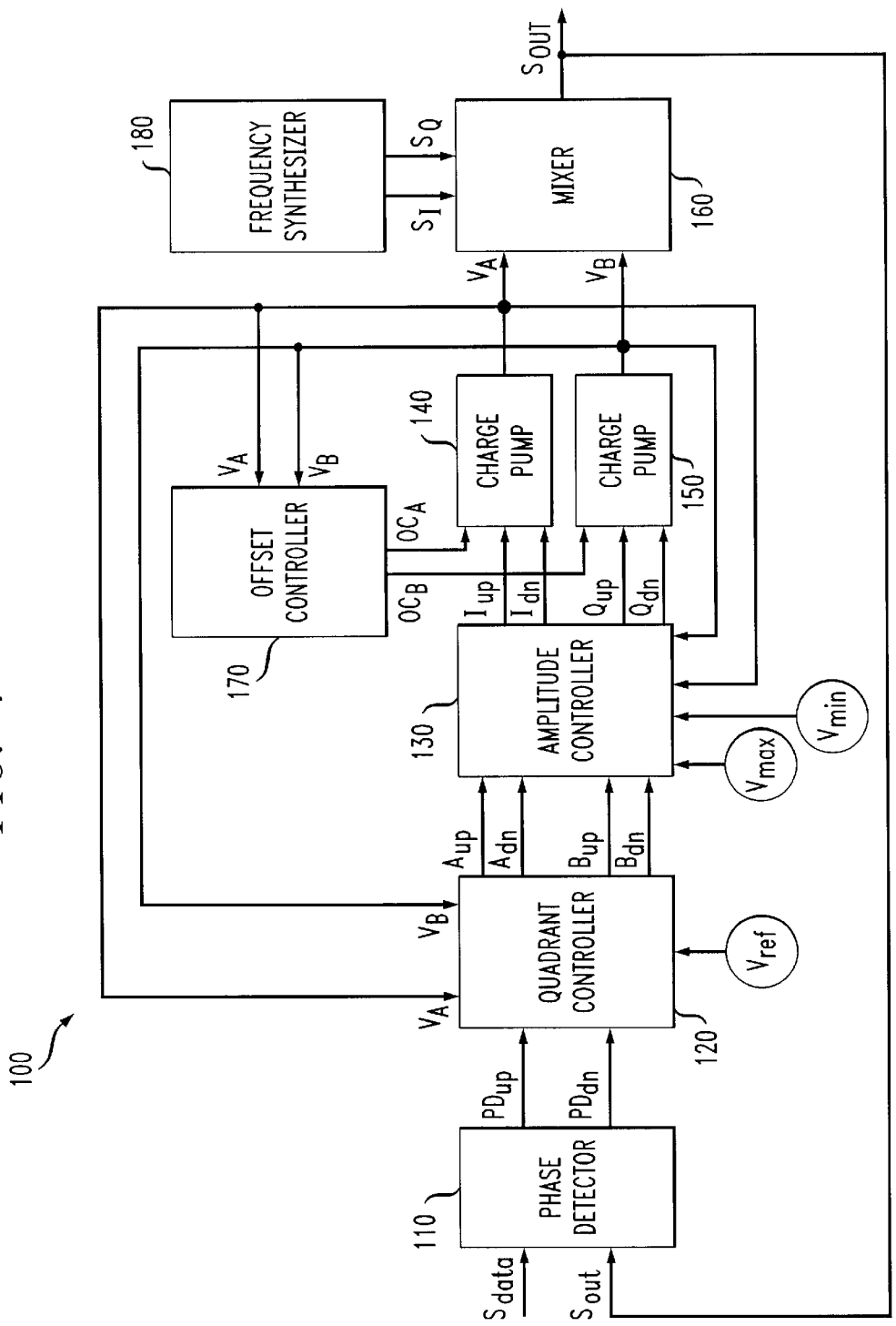
FIG. 1 illustrates a block diagram of one embodiment of a DLL circuit constructed according to the principles of the present invention.

Referring initially to FIG. 1, illustrated is a block diagram of one embodiment of a DLL circuit 100 constructed according to the principles of the present invention. The DLL 100 includes a phase detector 110 having two inputs, an input data signal $S_{data}$ and a mixer output signal $S_{out}$.

The phase detector generates a phase difference signal PD based on a phase comparison between the data signal $S_{data}$ and the mixer output signal $S_{out}$ of the DLL 100. In the illustrated embodiment, the phase detector 110 is a bang-bang phase detector, however other types of phase detectors may also be employed in the DLL 100. Also in the illustrated embodiment, the phase difference signal PD includes up $PD_{up}$ and down $PD_{dn}$ components. In such an embodiment, the phase detector 110 may generate a logical high on $PD_{up}$ and a logic low on $PD_{dn}$ of the phase detector's output when a phase of the data signal $S_{data}$ is ahead of a phase of the mixer output signal $S_{out}$.

Conversely, in the same embodiment, the phase detector 110 may generate a logical high on $PD_{dn}$ and logical low on $PD_{up}$ of the phase detector's output when a phase of the mixer output signal $S_{out}$ is ahead of a phase of the data signal $S_{data}$.

The DLL 100 further includes a quadrant controller 120, which receives the phase detector up and down signals $PD_{up}$, $PD_{dn}$. Coupled to the quadrant controller 120 is an amplitude controller 130, which receives signals from the quadrant controller 120. The amplitude controller 130 is coupled to an in-phase charge pump circuit 140 and a quadrature phase charge pump circuit 150. The charge pump circuits 140, 150 are in turn coupled to a mixer 160, as well as an offset controller 170. The mixer 160 provides the mixer output signal $S_{out}$ as the new clock signal generated by the DLL circuit 100, as well as the signal fed back to the phase detector 110.

Figure 2A:
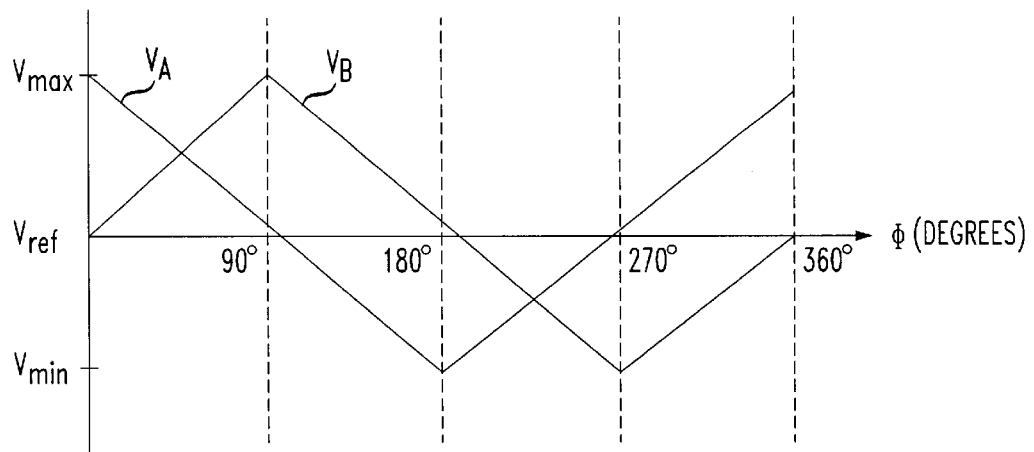
FIG. 2 illustrates a phase diagram and a Cartesian coordinate system demonstrating the relation between the voltage control signals and the phase between the output signal and the in-phase quadrature signal.
Figure 2B:
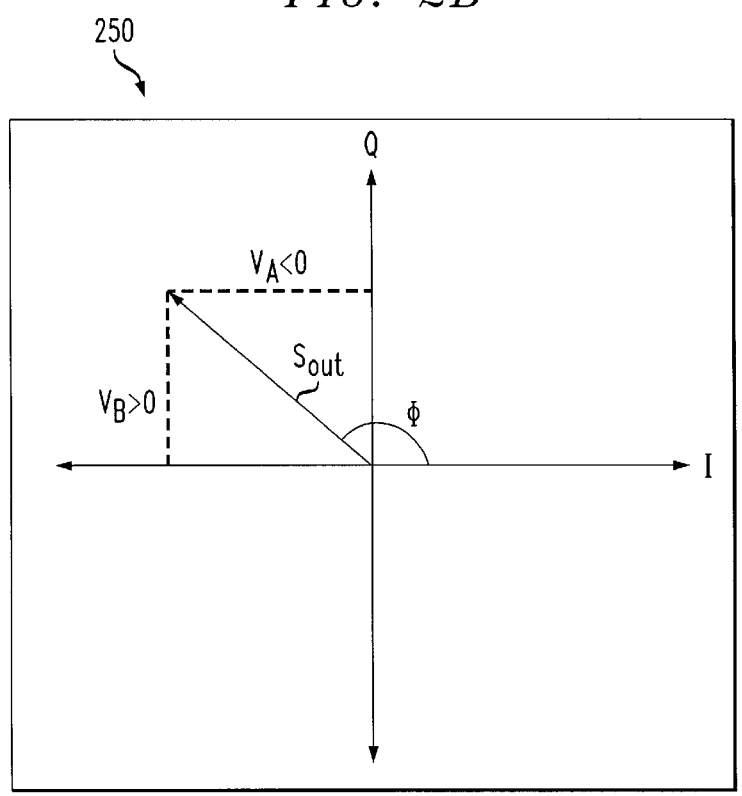

The mixer 160 provides the phase interpolation of the output signal $S_{out}$ through the operation expressed in the equation:

$$S_{out} = (V_A \cdot S_I) + (V_B \cdot S_Q)$$

where $S_I$ and $S_Q$ are local in-phase and quadrature phase clock signals $S_I$, $S_Q$. $S_Q$ is delayed 90 degrees compared to $S_I$, and $V_A$ and $V_B$ are voltage controls signals. Thus, since $V_A$ and $V_B$ are analog signals, the resulting phase shift on the output signal $S_{out}$ is continuous. In addition, in the illustrated embodiment, the mixer 160 is a four quadrant mixer 160, which results in a smooth quadrant transition without the "phase jump" at the quadrant borders found in the prior art. Looking briefly at FIG. 2, illustrated is a phase diagram 200 and a Cartesian coordinate system 250 demonstrating the relation between the voltage control signals $V_A$, $V_B$ and the phase between the output signal $S_{out}$ and the in-phase quadrature signal $S_I$. In order to delay the output signal $S_{out}$ (e.g., increase the quadrature phase signal $S_Q$), the voltage control signals $V_A$, $V_B$ are increased or decreased, depending on the quadrant in which the output signal vector $S_{out}$ is located. The quadrant controller 120 is used to update the up and down signals $Pd_{up}$, $PD_{dn}$ generated from the phase detector, such that the voltage control signals $V_A$ and $V_B$ will be moved in a correct direction. A quadrant detection circuit (not illustrated) within the quadrant controller 120 determines what quadrant the interpolated output signal $S_{out}$ is located. Only by determining the proper quadrant can it be known whether to increase or decrease the first voltage control signal $V_A$ and whether to increase or decrease the second voltage control signal $V_B$. In the illustrated embodiment, the in-phase and quadrature phase signals $S_I$, $S_Q$ are local clock signals, perhaps generated by a nearby phase-locked loop (PLL) circuit.

Figure 3A:
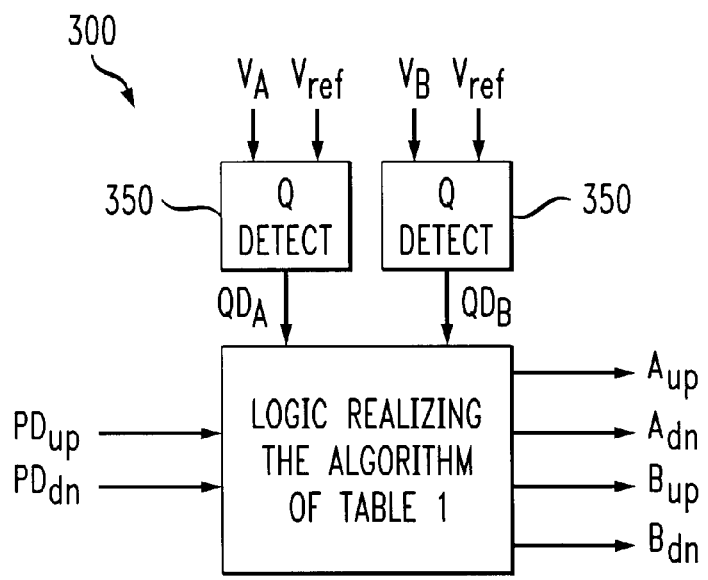
FIG. 3A illustrates a block diagram of one embodiment of a quadrant controller constructed according to the principles of the present invention.
Figure 3B:
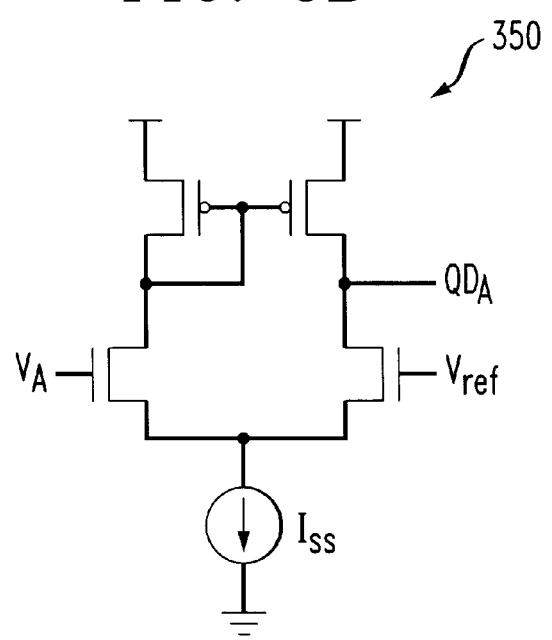
FIG. 3B illustrates one embodiment of a circuit diagram of a quadrant detector for use with the quadrant controller of FIG. 3A.

To determine in which quadrant the output signal $S_{out}$ is located, the quadrant controller 120 compares the first and second voltage control signals $V_A$, $V_B$, which in this embodiment are the voltage control signals the quadrant controller 120 causes to be generated, with a reference voltage $V_{ref}$. Based on these comparisons, the quadrant controller 120 generates first and second control signals A, B. In the illustrated embodiment, the first and second control signals A, B have up $A_{up}$, $B_{up}$ and down $A_{dn}$, $B_{dn}$ components, respectively. Turning briefly to FIGS. 3A and 3B, illustrated in FIG. 3A is one embodiment of a quadrant controller 300 having quadrant detectors 350, which compares the first and second voltage control signals $V_A$, $V_B$ with the reference voltage $V_{ref}$. The quadrant detectors 350 are illustrated sending first and second quadrant detector signals $QD_A$, $QD_B$ to a logic algorithm. The phase detector up and down signals $PD_{up}$, $PD_{dn}$, as well as the up and down components of the first and second control signals $A_{up}$, $A_{dn}$, $B_{up}$, $B_{dn}$, are also shown in relation to the logic algorithm. FIG. 3B illustrates one embodiment of a circuit diagram of the quadrant detectors 350 shown in FIG. 3A. Those skilled in the art understand that other embodiments of the quadrant detectors 350 may be employed without departing from the broad scope of the present invention.

With reference to Table 1, and continued reference to FIG. 1, set forth is one embodiment of a control algorithm, such as the algorithm discussed with respect to FIG. 3A, for use with the present invention.

TABLE 1

| | | |
|---|---|---|
| When $V_A > V_{ref}$ (Vector $S_{out}$ in 1$^{st}$ or 4$^{th}$ Quadrant) | — | $B_{up} = PD_{up}$ $B_{dn} = PD_{dn}$ |
| Else (Vector $S_{out}$ in 2$^{nd}$ or 3$^{rd}$ Quadrant) | — | $B_{up} = PD_{dn}$ $B_{dn} = PD_{up}$ |
| When $V_B > V_{ref}$ (Vector $S_{out}$ in 1$^{st}$ or 2$^{nd}$ Quadrant) | — | $A_{up} = PD_{dn}$ $A_{dn} = PD_{up}$ |
| Else (Vector $S_{out}$ in 3$^{rd}$ or 4$^{th}$ Quadrant) | — | $A_{up} = PD_{up}$ $A_{dn} = PD_{dn}$ |

In an exemplary embodiment, the first voltage control signal $V_A$ may be found to be greater than the reference voltage $V_{ref}$, meaning that a phase vector of the output signal $S_{out}$ is in either the first or fourth quadrant. In such a case, $PD_{up}$ is assigned to $B_{up}$, and $PD_{dn}$ is assigned to $B_{dn}$. The net result of these two signals is that the second voltage control signal $V_B$ increases in an effort to align the phases of the output signal $S_{out}$ to that of the data signal $S_{data}$. Conversely, if the first voltage control signal $V_A$ is not found to be greater than the reference voltage $V_{ref}$, meaning that a phase vector of the output signal $S_{out}$ is in either the second or third quadrant, $PD_{dn}$ is assigned to $B_{dn}$, and $PD_{up}$ is assigned to $B_{up}$, of the quadrant controller 120.

Similarly, the second voltage control signal $V_B$ may be found to be greater than the reference voltage $V_{ref}$, meaning that a phase vector of the output signal $S_{out}$ is in either the first or second quadrant. In this case, $PD_{up}$ is assigned to $A_{dn}$, and $PD_{dn}$ is assigned to $A_{up}$, of the quadrant controller 120. The net result is that the first voltage control signal $V_A$ will be decreased to delay the output signal $S_{out}$ when the output signal $S_{out}$ leads the data signal $S_{data}$. Conversely, if the second voltage control signal $V_B$ is not greater than the reference voltage $V_{ref}$, meaning that the phase vector of the output signal $S_{out}$ is in either the second or third quadrant, $PD_{dn}$ is assigned to $A_{up}$, and $PD_{up}$ is assigned to $A_{dn}$, of the quadrant controller 120.

As may be seen from the example above, the quadrant controller 120 can determine the precise quadrant the output phase vector is located, and thus generate the appropriate signals such that the phase of the output signal $S_{out}$ will be correctly shifted to align with the data signal $S_{data}$. In an embodiment where both the first and second voltage control signals $V_A$, $V_B$ are greater than the reference voltage $V_{ref}$, the phase vector must be in the first quadrant since that is the only common quadrant. If both the first and second voltage control signals $V_A$, $V_B$ are not greater than the reference voltage $V_{ref}$, the phase vector must be in the third quadrant since that is the only common quadrant. Likewise, if the first voltage control signal $V_A$ is greater than the reference voltage $V_{ref}$ but the second voltage control signal $V_B$ is not, the phase vector must be in the fourth quadrant. And, if the second voltage control signal $V_B$ is greater than the reference voltage $V_{ref}$ but the first voltage control signal $V_A$ is not, the phase vector must be in the second quadrant.

In a preferred embodiment of the present invention, the DLL 100 further includes an amplitude controller 130, coupled to the quadrant controller 120. In such embodiment, the amplitude controller 130 generates up and down signals $I_{up}$, $I_{dn}$ and $Q_{up}$, $Q_{dn}$ (of the in-phase and quadrature phase signals I and Q) based on the signals $A_{up}$, $A_{dn}$, $B_{up}$ and $B_{dn}$ output from the quadrant controller 120 and the first and second voltage control signals $V_A$, $V_B$. The amplitude controller 130 controls the amplitude of the first and second voltage control signals $V_A$, $V_B$ so that these signals are maintained within a desired amplitude range.

Figure 4A:
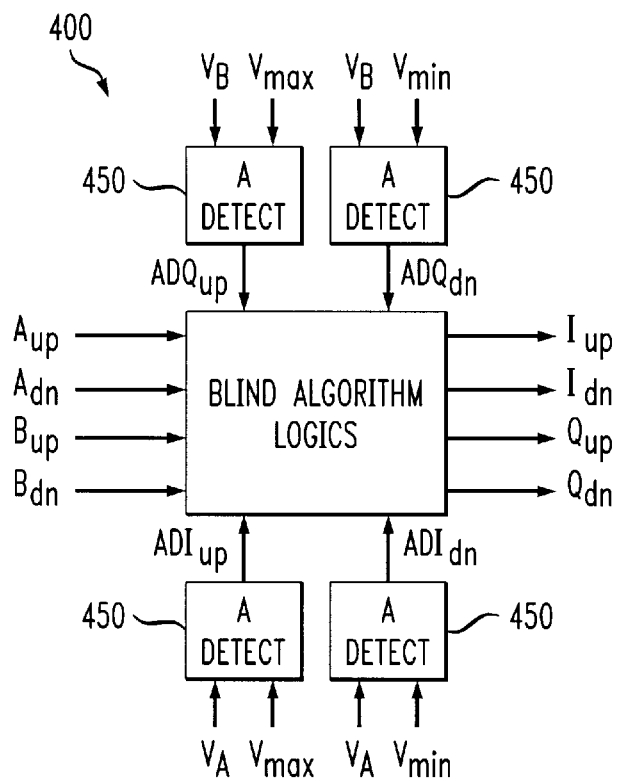
FIG. 4A illustrates a block diagram of one embodiment of an amplitude controller constructed according to the principles of the present invention.
Figure 4B:
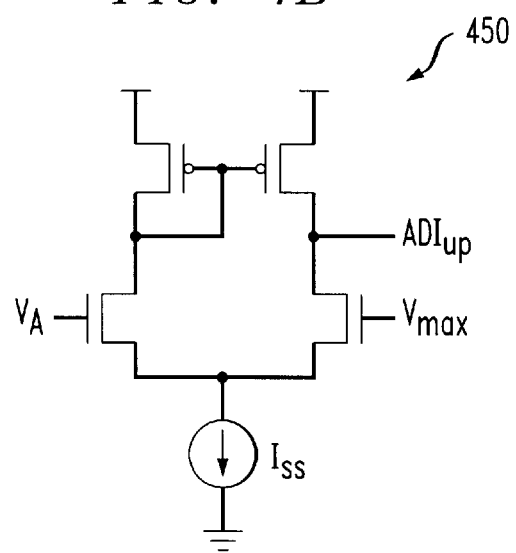
FIG. 4B illustrates one embodiment of a circuit diagram of an amplitude detector for use with the amplitude controller of FIG. 4A.

Looking more specifically at the amplitude controller 130, with reference to FIGS. 4A and 4B, the up component of the first or second control signals $A_{up}$, $B_{up}$ is blinded if the first or second voltage control signal $V_A$, $V_B$ is respectively larger than its allowed maximum value $V_{max}$. Similarly, the down component of the first or second control signals $A_{dn}$, $B_{dn}$ is blinded if the first or second voltage control signal $V_A$, $V_B$ is respectively smaller than its allowed minimum value $V_{min}$. Such blinding functions to prevent the first or second voltage control signal $V_A$, $V_B$ from exceeding its maximum $V_{max}$ or minimum $V_{min}$ magnitude.

The amplitude controller 130 may accomplish this purpose by following an algorithm such as the one illustrated in Table 2.

TABLE 2

When $V_A$ or $V_B > V_{max}$ - $I_{up} = 0$; $Q_{up} = 0$; $I_{dn} = A_{dn}$; $Q_{dn} = B_{dn}$
When $V_A$ or $V_B < V_{min}$ - $I_{dn} = 0$; $Q_{dn} = 0$; $I_{up} = A_{up}$; $Q_{up} = B_{up}$ When the first or second voltage control signal $V_A$, $V_B$ is found to be greater than the desired maximum magnitude $V_{max}$, the up components of the in-phase and quadrature phase control signals $I_{up}$, $Q_{up}$ are set to zero. In addition, the down components of the in-phase and quadrature phase control signals $I_{dn}$, $Q_{dn}$ are set equal to the down components of the first and second control signals $A_{dn}$, $B_{dn}$, respectively. Similarly, when the first or second voltage control signal $V_A$, $V_B$ is found to be less than the desired minimum magnitude $V_{min}$, the up components of the in-phase and quadrature phase control signals $I_{up}$, $Q_{up}$ are set equal to the up components of the first and second control signals $A_{up}$, $B_{up}$, respectively. Also, the down components of the in-phase and quadrature phase control signals $I_{dn}$, $Q_{dn}$ are set to zero.

As illustrated in FIG. 4A, amplitude detectors 450 can be seen making the comparison between the first and second voltage control signals $V_A$, $V_B$ and the maximum and minimum magnitudes $V_{max}$, $V_{min}$. As shown, if the first voltage control signal $V_A$ falls outside the desired range, the amplitude detectors 450 generate in-phase amplitude detector signals $ADI_{up}$, $ADI_{dn}$ to prevent $V_A$ from going beyond the allowed range. Likewise, if the second voltage control signal $V_B$ falls outside the desired range, the amplitude detectors 450 generate quadrature phase amplitude detector signals $ADQ_{up}$, $ADQ_{dn}$ to correct the problem. FIG. 4B illustrates one embodiment of the amplitude detectors used with the amplitude controller 400 illustrated in FIG. 4A. As with the quadrant detectors 350, those skilled in the art understand that other embodiments of the amplitude detectors 450 may be employed without departing from the broad scope of the present invention.

The DLL 100 further includes in-phase and quadrature phase charge pump circuits 140, 150. The in-phase and quadrature phase charge pump circuits 140, 150 are coupled to the amplitude controller 130, and are configured to generate the first and second voltage control signals $V_A$, $V_B$ based on the local in-phase and quadrature phase control signals I, Q, respectively. In an exemplary embodiment of the present invention, the in-phase and quadrature phase charge pump circuits 140, 150 each include loop filters (not illustrated) to assist in generating the first and second voltage control signals $V_A$, $V_B$, however other embodiments may include other components as well. The up and down currents in the charge pump circuits 140, 150 are offset by the offset controller 170 to prevent the case where both the first and second voltage control signals $V_A$, $V_B$ are equal to, or very close to, the reference voltage $V_{ref}$. In accordance with the principles described herein, since phase interpolation does not depend on the absolute values of the first and second voltage control signals $V_A$, $V_B$, but rather only on their ratio, the offset controller 170 is employed to push the voltage control signals $V_A$, $V_B$ towards their maximum and minimum values $V_{max}$, $V_{min}$. The offset controller 170 accomplishes this by generating an offset control signal for each of the in-phase and quadrature phase charge pump circuits 140, 150 based on the first and second voltage control signals $V_A$, $V_B$, respectively.

In one embodiment, the offset controller 170 may work with the charge pump circuits 140, 150 to accomplish this using the algorithm shown in Table 3.

TABLE 3

| When $V_A$ or $V_B > V_{ref}$ - | $I_1 = I_0 + I_{offset}$ |
| --- | --- |
| | $I_2 = I_0$ |
| Else - | $I_1 = I_0$ |
| | $I_2 = I_0 + I_{offset}$ |

Specifically, when the first voltage control signal $V_A$ is found to be greater than the reference voltage $V_{ref}$, an up current $I_1$ of the in-phase charge pump 140 is set higher than a down current $I_2$. This begins to move the first voltage control signal $V_A$ toward the maximum value $V_{max}$. Otherwise, the up current $I_1$ of the in-phase charge pump 140 is set lower than the down current $I_2$. This would move the first voltage control signal $V_A$ towards the minimum value $V_{min}$. Of course, the amplitude controller 130 prevents the first voltage control signal $V_A$ from falling outside the range of the maximum and minimum values $V_{max}$, $V_{min}$, as discussed above. One embodiment of the in-phase charge pump 140 illustrating these relationships is shown in FIG. 6 and discussed in further detail below.

Similar to the in-phase charge pump 140, in the quadrature phase charge pump 150, when the second voltage control signal $V_B$ is found to be greater than the reference voltage $V_{ref}$, an up current of the quadrature phase charge pump 150 is set higher than a down current. This begins to move the second voltage control signal $V_B$ toward the maximum value $V_{max}$. Otherwise, the up current of the quadrature phase charge pump 150 is set lower than the down current. This moves the second voltage control signal $V_B$ towards the minimum value $V_{min}$. As with the first voltage control signal $V_A$, the amplitude controller 130 prevents the second voltage control signal $V_B$ from falling outside the range of the maximum and minimum values $V_{max}$, $V_{min}$.

Figure 5A:
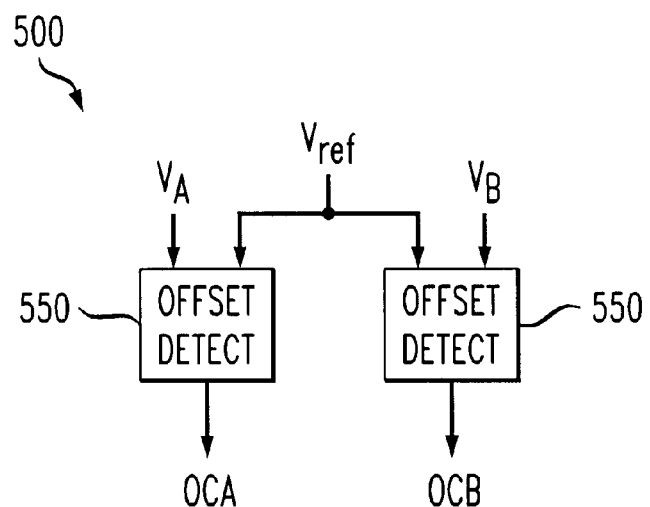
FIG. 5A illustrates a block diagram of one embodiment of an offset controller constructed according to the principles of the present invention.
Figure 5B:
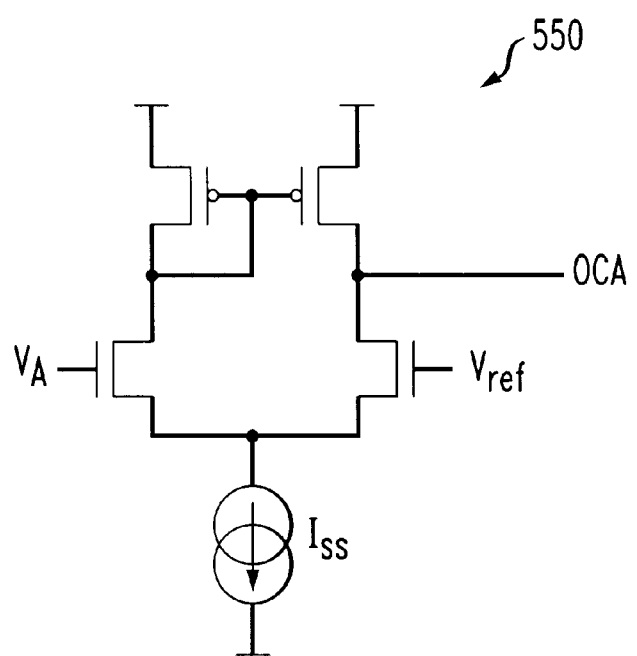
FIG. 5B illustrates one embodiment of a circuit diagram of an offset detector for use with the offset controller of FIG. 5A.

Turning briefly to FIG. 5A, illustrated is a block diagram of one embodiment of an offset controller 500 constructed according to the principles of the present invention. As illustrated, the offset controller 500 employees offset detectors 550 to make comparisons between the first and second voltage control signals $V_A$, $V_B$ and the reference signal $V_{ref}$. A result of the comparison between the first voltage control signal $V_A$ and the reference signal $V_{ref}$ is output from the offset controller 500 as a first offset controller output signal $OC_A$. Likewise, a result of the comparison between the second voltage control signal $V_B$ and the reference signal $V_{ref}$ is output from the offset controller 500 as a second offset controller output signal $OC_B$. FIG. 5B illustrates one embodiment of a circuit diagram of one of the offset detectors 550 for use with the offset controller 500 of FIG. 5A.

Figure 6:
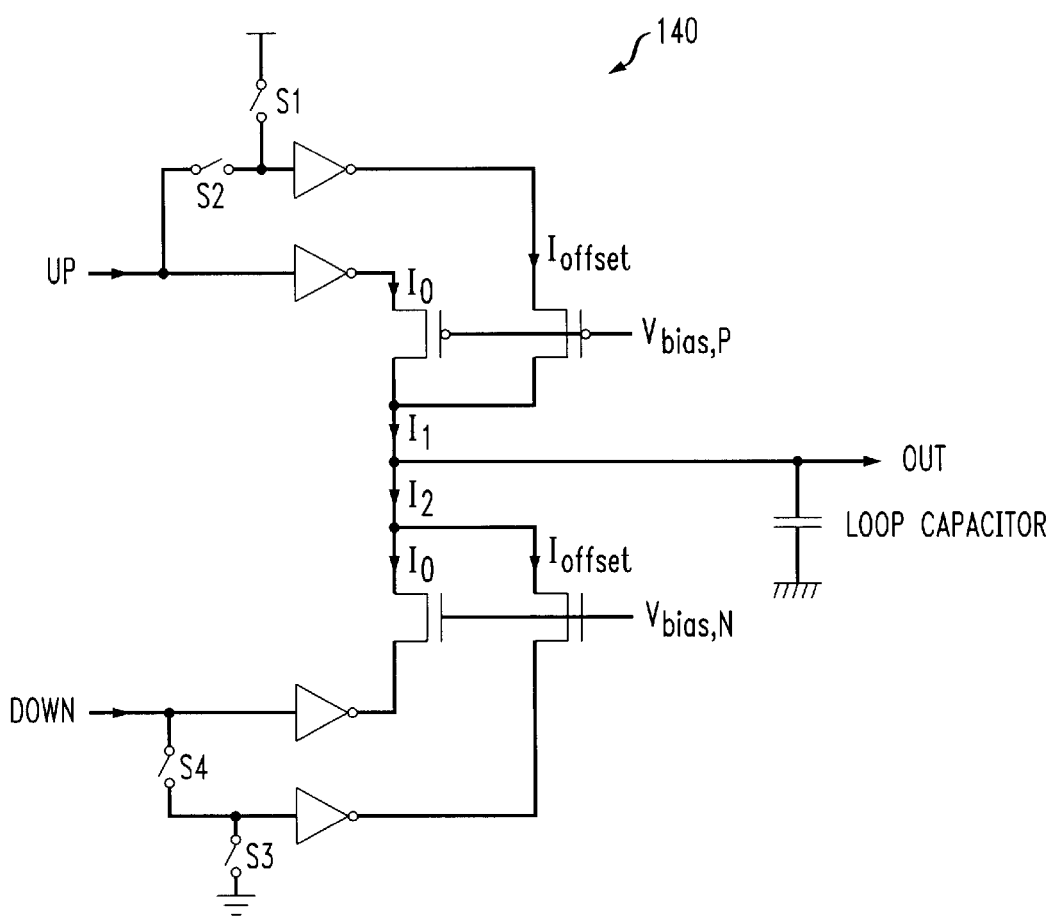
FIG. 6 illustrates a circuit diagram of one embodiment of the in-phase charge pump circuit illustrated in FIG. 1.

Looking now at FIG. 6, with continued reference to Table 3, illustrated is a circuit diagram of one embodiment of the in-phase charge pump circuit 140 illustrated in FIG. 1. The inputs of the charge pump 140, labeled up and down, are from the amplitude controller 130, i.e., $I_{up}$, $I_{dn}$ for the in-phase charge pump 140 (and $Q_{up}$, $Q_{dn}$ for the quadrature phase charge pump 150). In the charge pump 140, when the first voltage control signal $V_A$ is greater than the reference voltage $V_{ref}$ (following the algorithm set forth in Table 3), a first switch S1 and a fourth switch S4 are turned off and a second switch S2 and a third switch S3 are turned on. In this situation, the in-phase charge pump circuit's 140 up-current $I_1$ is equal to a first current $I_0$ plus an offset current $I_{offset}$, while the down-current $I_2$ is only set equal to the first current $I_0$.

Conversely, when the first voltage control signal $V_A$ is less than the reference voltage $V_{ref}$, the first switch S1 and the fourth switch S4 are turned on and the second switch S2 and the third switch S3 are turned off. In this case, the in-phase charge pump circuit's 140 up-current $I_1$ is equal only to the first current $I_0$, while the down-current $I_2$ is set equal to the first current $I_0$ plus the offset current $I_{offset}$. Analogous outcomes would hold for the quadrature phase charge pump circuit 150, and comparing the second voltage control signal $V_B$ with the reference voltage $V_{ref}$.

Figure 7:
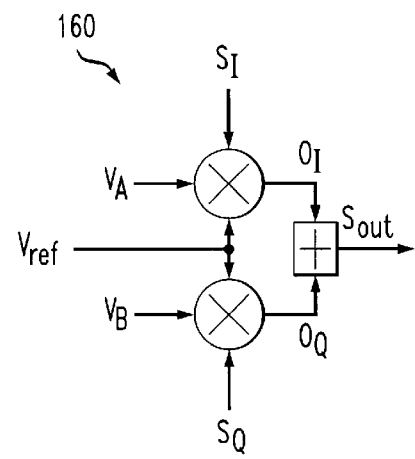
FIG. 7 illustrates one embodiment of a four quadrant mixer constructed according to the present invention.

Referring now to FIG. 7, with continued reference to FIG. 1, illustrated is one embodiment of a four quadrant mixer 160 constructed according to the present invention. In accordance with the principles described herein, the mixer 160 is a "four quadrant mixer" since it allows phase interpolation in all four quadrants. As illustrated in FIG. 1, the mixer 160 is coupled to the in-phase and quadrature phase charge pump circuits 140, 150.

In accordance with the present invention, the mixer 160 is configured to generate the output signal $S_{out}$ based on the first and second voltage control signals $V_A$, $V_B$, the local in-phase and quadrature phase clock signals $S_I$, $S_Q$, and the reference signal $V_{ref}$. By combining the first voltage control signal $V_A$ with the local in-phase signal $S_I$ and the reference signal $V_{ref}$, the mixer 160 generates an in-phase component $O_I$ of the output signal $S_{out}$. Likewise, by combining the second voltage control signal $V_B$ with the local quadrature phase signal $S_Q$ and the reference signal $V_{ref}$, the mixer 160 generates a quadrature phase component $O_Q$. Then, by combining the in-phase and quadrature phase components $O_I$, $O_Q$, the mixer 160 produces the output signal $S_{out}$ having the desired phase established by the DLL 100. Once the output signal $S_{out}$ is phase-locked to the incoming data signal $S_{data}$, the output signal $S_{out}$ may be transmitted to the numerous components within a larger circuit that rely on the timing provided by the output signal $S_{out}$ and the DLL 100 as a whole.

Figure 8:
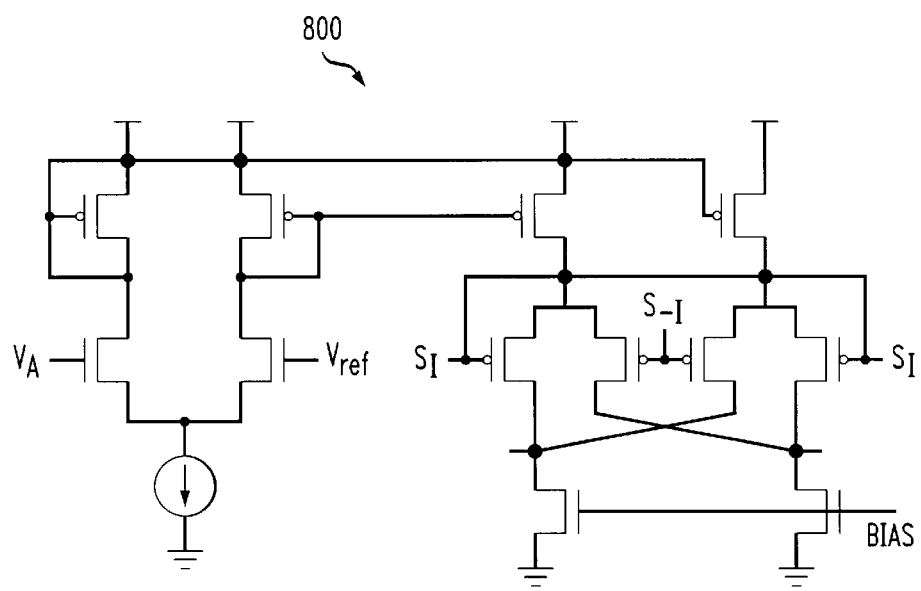
FIG. 8 illustrates a circuit diagram of one embodiment of an output signal circuit representing a portion of the four quadrant mixer of FIG. 7.

Turning finally to FIG. 8, illustrated is a circuit diagram of one embodiment of an output signal circuit 800 representing a portion of the four quadrant mixer 160 of FIG. 7. Specifically, the output signal circuit 800 represents a circuit embodying only the half of the mixer 160 shown in FIG. 7 that combines the first voltage control signal $V_A$, the local in-phase clock signal $S_I$, and the reference signal $V_{ref}$. Positive and negative values representing the local in-phase signal $S_I$, $S_{-I}$ are input to the circuit 800 and are eventually mixed with the first voltage control signal $V_A$ and the reference signal $V_{ref}$. Those skilled in the art understand how to create an output signal circuit in accordance with the principles described herein, as well as that such circuits may include greater of fewer components than are illustrated in FIG. 8, without departing from the broad scope of the present invention.

By providing a DLL circuit that can perform phase interpolation in all four quadrants, rather than only in one quadrant, the present invention provides several benefits over the prior art. For instance, the present invention provides for generating an output signal without the jitter or phase discontinuity associated with analogous circuits found in the prior art. Those skilled in the art understand that continuous phase interpolation, rather than the discrete, discontinuous interpolation that occurs in prior art circuits, allows for more efficient clock and data recovery. Moreover, a DLL circuit constructed according to the present invention is employable with almost any CDR, while retaining benefits such as those described above.

Although the present invention has been described in detail, those skilled in the art should understand that they can make various changes, substitutions and alterations herein without departing from the spirit and scope of the invention in its broadest form.

What is claimed is:

1. A delay-locked loop (DLL) having a mixer, comprising:
   a phase detector that generates a phase difference signal based on a phase comparison between a data signal and an output signal from said mixer; and
   a quadrant controller, coupled to said phase detector, that generates first and second control signals to said mixer based on said phase difference signal and first and second voltage control signals.

2. The DLL as recited in claim 1 further comprising an amplitude controller, coupled between said quadrant controller and said mixer, that generates in-phase and quadrature phase control signals based on said first and second control signals and said first and second voltage control signals.

3. The DLL as recited in claim 2 further comprising in-phase and quadrature phase charge pump circuits, coupled to said amplitude controller, that generate said first and second voltage control signals based on said in-phase and quadrature phase control signals.

4. The DLL as recited in claim 3 further comprising an offset controller, coupled to said in-phase and quadrature phase charge pump circuits, that generates an offset control signal for said in-phase and quadrature phase charge pump circuits based on said first and second voltage control signals.

5. The DLL as recited in claim 4 wherein said mixer generates said mixer output signal based on said first and second voltage control signals and local in-phase and quadrature phase clock signals.

6. The DLL as recited in claim 1 wherein said phase detector is a bang-bang phase detector and said phase difference signal has up and down components.

7. The DLL as recited in claim 1 wherein said first and second control signals have up and down components each.

8. A method of performing clock and data recovery, comprising:
   generating a phase difference signal based on a phase comparison between a data signal and an output signal of a mixer; and
   generating first and second control signals to said mixer using a quadrant controller based on said phase difference signal and first and second voltage control signals.

9. The method as recited in claim 8 further comprising generating in-phase and quadrature phase control signals to said mixer using an amplitude controller based on said first and second control signals and said first and second voltage control signals.

10. The method as recited in claim 9 further comprising generating said first and second voltage control signals based on said in-phase and quadrature phase control signals.

11. The method as recited in claim 10 further comprising generating an offset control signal for said in-phase and quadrature phase charge pump circuits based on said first and second voltage control signals.

12. The method as recited in claim 11 further comprising generating said mixer output signal based on said first and second voltage control signals and local in-phase and quadrature phase clock signals.

13. The method as recited in claim 8 wherein said generating said phase difference signal is carried out by a bang-bang phase detector and said phase difference signal has up and down components.

14. The method as recited in claim 8 wherein said first and second control signals have up and down components each.

15. A four quadrant delay-locked loop (DLL), comprising:
   a mixer;
   a phase detector that generates a phase difference signal based on a phase comparison between a data signal and an output signal of a mixer;
   a quadrant controller, coupled to said phase detector, that generates first and second control signals based on said phase difference signal and first and second voltage control signals;
   an amplitude controller, coupled to said quadrant controller, that generates in-phase and quadrature phase control signals based on said first and second control signals and said first and second voltage control signals; and
   in-phase and quadrature phase charge pump circuits, coupled to said amplitude controller and said mixer, that generate said first and second voltage control signals based on said in-phase and quadrature phase control signals.

16. The DLL as recited in claim 15 further comprising an offset controller, coupled to said in-phase and quadrature phase charge pump circuits, that generates an offset control signal for said quadrature phase charge pump circuit based on said first and second voltage control signals.

17. The DLL as recited in claim 15 wherein said mixer generates said mixer output signal based on said first and second voltage control signals and said local in-phase and quadrature phase clock signals.

18. The DLL as recited in claim 15 wherein said phase detector is a bang-bang phase detector and said phase difference signal has up and down components.

19. The DLL as recited in claim 15 wherein said first and second control signals have up and down components each.

20. The DLL as recited in claim 15 wherein said DLL is embodied in an integrated circuit.

* * * * *